(12) United States Patent
Kim et al.

(10) Patent No.: US 11,605,793 B2
(45) Date of Patent: Mar. 14, 2023

(54) STRETCHABLE DEVICES, DISPLAY PANELS, SENSORS, AND ELECTRONIC DEVICES

(71) Applicant: Samsung Electronics Co., Ltd., Suwon-si (KR)

(72) Inventors: Joo Young Kim, Hwaseong-si (KR); Youngjun Yun, Yongin-si (KR); Don-Wook Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 37 days.

(21) Appl. No.: 17/081,376

(22) Filed: Oct. 27, 2020

(65) Prior Publication Data

US 2021/0296599 A1 Sep. 23, 2021

(30) Foreign Application Priority Data

Mar. 17, 2020 (KR) .................. 10-2020-0032719

(51) Int. Cl.
*H01L 51/00* (2006.01)
*H01L 27/32* (2006.01)
*G01N 27/30* (2006.01)

(52) U.S. Cl.
CPC ...... *H01L 51/0097* (2013.01); *H01L 27/3227* (2013.01); *H01L 27/3246* (2013.01); *G01N 27/30* (2013.01)

(58) Field of Classification Search
None
See application file for complete search history.

(56) References Cited

U.S. PATENT DOCUMENTS 9,306,180 B2 4/2016 Kim
9,401,485 B2 7/2016 Deng et al.
(Continued)

FOREIGN PATENT DOCUMENTS

KR 10-1207209 B1 12/2012
KR 10-1347053 B1 1/2014
(Continued)

OTHER PUBLICATIONS

"Lecture 3", downloaded from URL<https://bkict-ocw.knu.ac.kr/caster/file/lecture/595F6720446E9.pdf> on Jun. 8, 2022. (Year: 2022).*
(Continued)

*Primary Examiner* — J. E. Schoenholtz
(74) *Attorney, Agent, or Firm* — Harness, Dickey & Pierce, P.L.C.

(57) ABSTRACT

A stretchable device includes a substrate, the substrate including first regions having a first stiffness and a second region between adjacent first regions and having a second stiffness that is lower than the first stiffness, a unit device array including unit devices on separate, respective first regions of the substrate, and an encapsulant covering the unit device array. The unit device array includes pixel electrodes isolated on separate, respective first regions of the substrate, common electrodes isolated on separate, respective first regions and each facing a separate pixel electrode, the stretchable device configured to apply a same voltage to the plurality of common electrodes, and active layers on separate, respective first regions and each between a separate pixel electrode and a separate common electrode.

18 Claims, 26 Drawing Sheets

(56) References Cited

U.S. PATENT DOCUMENTS

| | | | |
|---|---|---|---|
| 2011/0148839 A1* | 6/2011 | Hwang | G02B 5/205 |
| | | | 345/76 |
| 2016/0211483 A1 | 7/2016 | Kwon | |
| 2020/0006684 A1 | 1/2020 | Liu et al. | |
| 2020/0037442 A1 | 1/2020 | Keum et al. | |
| 2020/0235187 A1* | 7/2020 | Bae | H01L 27/3272 |
| 2021/0313527 A1* | 10/2021 | Hong | H01L 27/3248 |
| 2021/0336162 A1* | 10/2021 | Guo | H01L 27/3262 |
| 2022/0149313 A1 | 5/2022 | Nakamura et al. | |

FOREIGN PATENT DOCUMENTS

| | | |
|---|---|---|
| KR | 10-2015-0077135 A | 7/2015 |
| KR | 10-1551823 B1 | 9/2015 |
| KR | 10-2016-0020034 A | 2/2016 |
| KR | 2016-0087291 A | 7/2016 |
| KR | 10-1663407 B1 | 10/2016 |

OTHER PUBLICATIONS

Extended European Search Report dated Mar. 29, 2021 for corresponding European Application No. 20205629.7.
European Communication pursuant to Article 94(3) EPC dated Oct. 5, 2022 for corresponding European Application No. 20205629.7.
U.S. Office Action dated Jan. 24, 2023 for corresponding U.S. Appl. No. 17/594,958.

* cited by examiner

STRETCHABLE DEVICES, DISPLAY PANELS, SENSORS, AND ELECTRONIC DEVICES

CROSS-REFERENCE TO RELATED APPLICATION

This application claims priority to and the benefit of, under 35 U.S.C. § 119, Korean Patent Application No. 10-2020-0032719 filed in the Korean Intellectual Property Office on Mar. 17, 2020, the entire contents of which are incorporated herein by reference.

BACKGROUND

1. Field

Stretchable devices, display panels, sensors, and electronic devices are disclosed.

2. Description of the Related Art

Recently, research has been conducted on attachable devices that directly attach display devices or biological devices such as smart skin devices, soft robots, and biomedical devices to skin or clothing to skin or clothing.

However, since such an attachable device needs to have stretchability in an arbitrary direction according to an movement of a living body, and simultaneously, is able to maintain its original performance after being restored, a new structure different from conventional devices is required.

SUMMARY

Some example embodiments provide a stretchable device having a new structure.

Some example embodiments provide a display panel including the stretchable device.

Some example embodiments provide a sensor including the stretchable device.

Some example embodiments provide an electronic device including the stretchable device, the display panel, or the sensor.

According to some example embodiments, a stretchable device may include a substrate. The substrate may include a plurality of first regions having a first stiffness and a second region between adjacent first regions of the plurality of first regions and having a second stiffness that is lower than the first stiffness. The stretchable device may include a unit device array. The unit device array may include a plurality of unit devices on separate, respective first regions of the plurality of first regions of the substrate. The stretchable device may include an encapsulant covering the unit device array. The unit device array may include a plurality of pixel electrodes isolated on separate, respective first regions of the plurality of first regions of the substrate, a plurality of common electrodes isolated on separate, respective first regions of the plurality of first regions of the substrate, each common electrode of the plurality of common electrodes facing a separate pixel electrode of the plurality of pixel electrodes, the stretchable device configured to apply a same voltage to the plurality of common electrodes, and a plurality of active layers on separate, respective first regions of the plurality of first regions of the substrate, each active layer between a separate pixel electrode of the plurality of pixel electrodes and a separate common electrode of the plurality of common electrodes.

The substrate may include an elastomer.

A difference between elastic moduli of the plurality of first regions and the second region of the substrate may be about 100 times or more.

An elongation rate of the first region of the substrate may be less than or equal to about 5%, and an elongation rate of the second region of the substrate may be about 10% to about 100%.

The plurality of first regions of the substrate may each have an island-shape and are isolated from direct contact with each other, and the second region of the substrate may be a single, continuous structure in the substrate.

The stretchable device may further include a connecting electrode connecting the plurality of common electrodes.

The connecting electrode may be on the second region of the substrate, or the connecting electrode may be on both the first region and the second region of the substrate.

The connecting electrode may be a stretchable electrode.

The connecting electrode may include conductive nanostructures.

The stretchable device may further include a pixel definition layer between adjacent unit devices of the unit device array, the pixel definition layer having via holes corresponding to separate, respective unit devices of the unit device array. Each common electrode may be connected to the connecting electrode through a separate via hole of the via holes of the pixel definition layer.

The pixel definition layer may include an elastomer.

The encapsulant may include a plurality of encapsulants that are isolated from direct contact with each other and are on separate, respective first regions of the plurality of first regions of the substrate.

The plurality of encapsulants and the plurality of common electrodes may have a same planar shape.

The encapsulant may be on a whole surface of the substrate and include a cured product of a photosensitive elastomer.

The encapsulant may include a cured product of a photosensitive elastomer curable at a temperature of less than or equal to about 100° C.

The active layer may be a light emitting layer or a photoelectric conversion layer.

The active layer may be the light emitting layer, and the light emitting layer may include an organic light emitting material, an inorganic light emitting material, quantum dots, a perovskite, or a combination thereof.

A display panel may include the stretchable device.

A sensor may include the stretchable device.

The sensor may include a light emitting diode configured to emit a first light, and a photoelectric conversion device configured to sense a second light generated based on reflection of the first light by an object. At least one of the light emitting diode or the photoelectric conversion device may include the stretchable device.

The sensor may be a biosensor.

An electronic device may include the stretchable device, the display panel, and/or the sensor.

According to some example embodiments, a stretchable device may include a substrate. The substrate may include a first region having a first stiffness and a second region adjacent to the first region and having a second stiffness that is lower than the first stiffness. The stretchable device may include a unit device on the first region of the substrate; and an encapsulant covering the unit device. The unit device may include a pixel electrode on the first region of the substrate, a common electrode on the pixel electrode, and an active layer between the pixel electrode and the common electrode.

The substrate may include an elastomer.

A difference between elastic moduli of the first region and the second region of the substrate may be about 100 times or more.

An elongation rate of the first region of the substrate may be less than or equal to about 5%, and an elongation rate of the second region of the substrate may be about 10% to about 100%.

The second region of the substrate may completely surround the first region of the substrate in a horizontal direction extending parallel to the substrate.

The stretchable device may further include a connecting electrode connected to the common electrode. The connecting electrode may be on the second region of the substrate, or the connecting electrode may be on both the first region and the second region of the substrate.

The connecting electrode may be a stretchable electrode.

The connecting electrode may include conductive nanostructures.

The active layer may be a light emitting layer or a photoelectric conversion layer.

The stretchable device may flexibly respond to external forces or external movements, such as twisting, pressing, and pulling it in a particular (or, alternatively, predetermined) direction, and simultaneously prevent damages or destruction of the unit device, so that it may be effectively applied to an attachable device attached directly to the skin or clothing.

DETAILED DESCRIPTION

Figure 1:
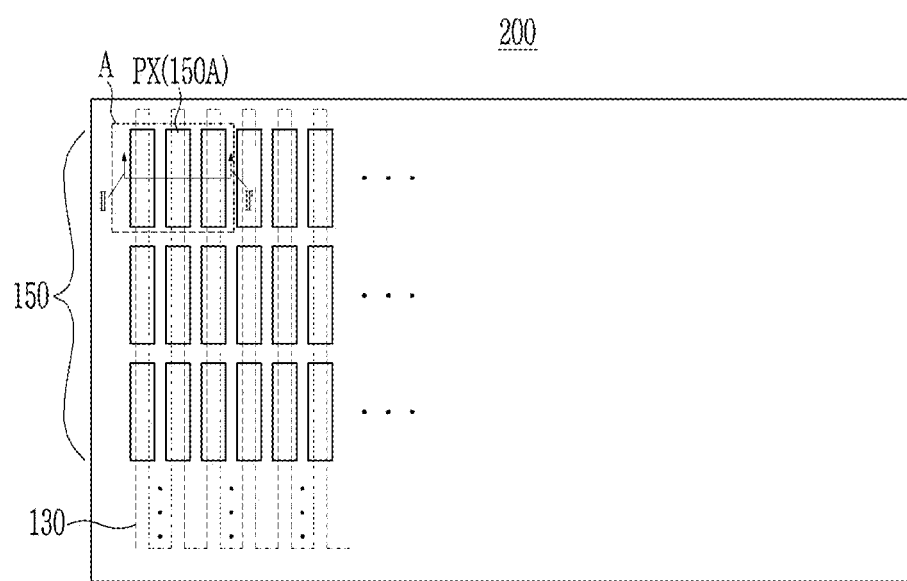
FIG. 1 is a schematic view showing an example of a pixel arrangement of a stretchable device according to some example embodiments.

Hereinafter, some example embodiments are described in detail so that those skilled in the art can easily implement them. However, the actual applied structure may be implemented in various different forms and is not limited to the example embodiments described herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present (i.e., indirectly on the other element). In contrast, when an element is referred to as being "directly on" another element, there are no intervening elements present.

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, the term "combination" includes a mixture and two or more stacked structures.

Hereinafter, a stretchable device according to some example embodiments is described with reference to the drawings.

FIG. 1 is a schematic view showing an example of a pixel arrangement of a stretchable device according to some example embodiments.

Referring to FIG. 1, the stretchable device 200 may include a plurality of pixels PXs, and the plurality of pixels PXs may have a matrix arrangement repeatedly arranged along rows and/or columns. The stretchable device 200 may include a repeatedly arranged unit pixel group "A", and a plurality of pixels PXs included in the unit pixel group "A" may have an arrangement such as 3×1, 2×2, 3×3, or 4×4, but is not limited thereto. The arrangement of the pixels PXs may be, in some example embodiments, a Bayer matrix, a PenTile matrix, and/or a diamond matrix, but is not limited thereto.

In some example embodiments, each pixel PX may include a unit device 150A, and each unit device 150A may independently display red R, green G, blue B, or a combination thereof, such as white W. In some example embodiments, the unit pixel group "A" may have an arrangement such as RGB, RGBG, or RGBW, but is not limited thereto.

Figure 2:
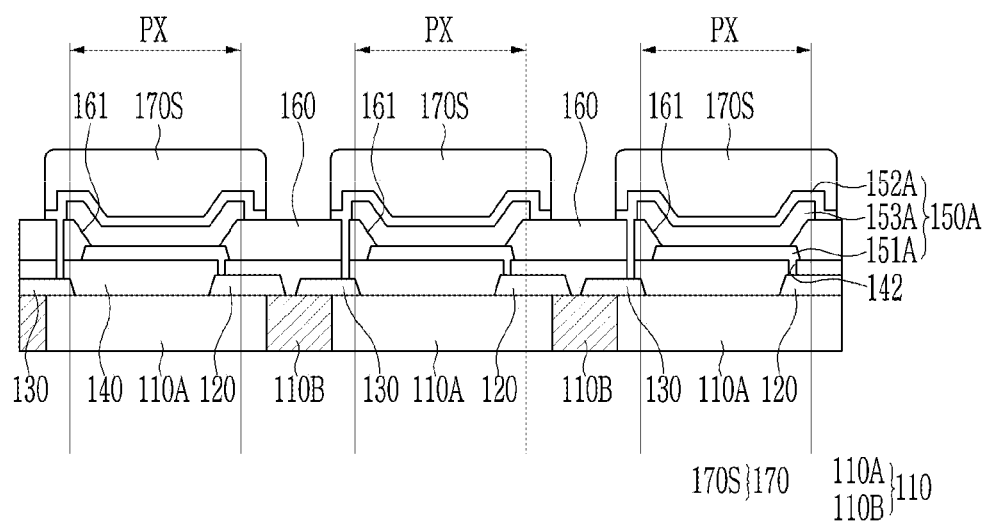
FIG. 2 is a cross-sectional view taken along line II-II' of an example of the stretchable device of FIG. 1 according to some example embodiments.

In some example embodiments, each pixel PX may include a unit device 150A, and each unit device 150A may be configured to selectively absorb or sense light of a red wavelength spectrum R, a green wavelength spectrum G, a blue wavelength spectrum B, a whole visible light wavelength spectrum W, or an infrared wavelength spectrum IR. In some example embodiments, the unit pixel group "A" may have an arrangement such as RGB, RGBG, RGBW, or RGBIR, but is not limited thereto. In some example embodiments, for example as shown in FIG. 1, each separate pixel PX may be defined as a separate unit device 150A. As shown in FIG. 2, in some example embodiments, each separate pixel PX may be defined as a separate portion of the stretchable device having horizontal boundaries that are defined by a separate opening 161 and includes some or all portions of the stretchable device that vertically overlap (e.g., overlap in the direction extending perpendicular to the substrate 110) with the separate opening 161. As described herein, the horizontal direction may refer to a direction extending parallel to the substrate 110 and the vertical direction may refer to a direction extending perpendicular to the substrate 110.

The unit device 150A may be repeatedly arranged along rows and/or columns to form a unit device array 150.

In the drawing, although all the pixels PXs are depicted to have the same size, the present disclosure is not limited thereto. One or more pixels PXs belonging to the unit pixel group "A" may be larger or smaller than other pixels PXs. In the drawing, although all the pixels PXs are depicted to have the same shape, the present disclosure is not limited thereto. One or more pixels PXs belonging to the unit pixel group "A" may have different shapes from other pixels PXs.

Figure 3:
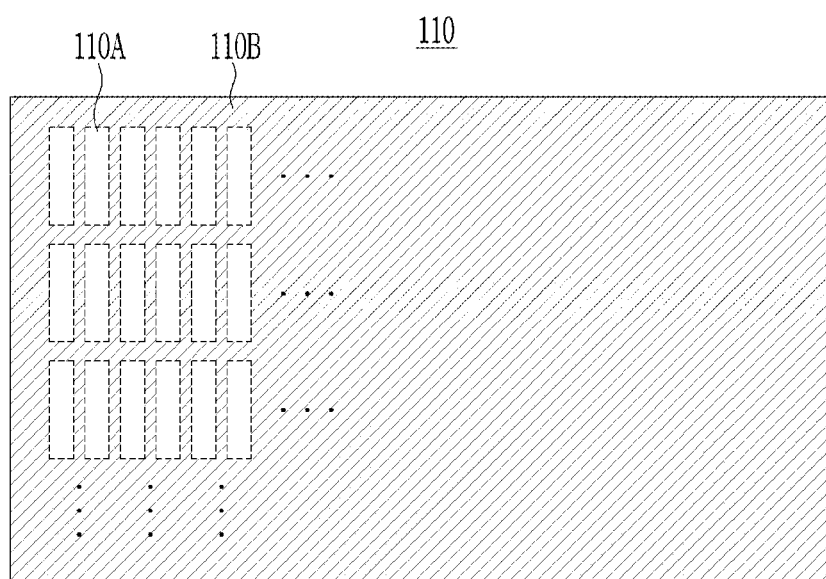
FIG. 3 is a top plan view showing an example of the substrate of the stretchable devices of FIGS. 1 and 2 according to some example embodiments.

FIG. 2 is a cross-sectional view taken along line II-II' of an example of the stretchable device of FIG. 1 and FIG. 3 is a top plan view showing an example of the arrangement of the first region and the second region of the substrate of the stretchable devices of FIGS. 1 and 2.

Referring to FIG. 2, the stretchable device 200 according to some example embodiments includes a substrate 110, a transistor 120, a connecting electrode 130, an insulating layer 140, a unit device 150A, a pixel definition layer 160, and an encapsulant 170. The encapsulant 170 may be referred to interchangeably herein as an encapsulation layer, encapsulation structure, or the like. As further shown, the encapsulant 170 may include a plurality of separate encapsulants 170S.

The substrate 110 may be a stretchable substrate, and may include an elastomer. The elastomer may include an organic elastomer, an organic-inorganic elastomer, an inorganic elastomer-like material, or a combination thereof. The organic elastomer or the organic-inorganic elastomer may be, in some example embodiments, substituted or unsubstituted polyorganosiloxane such as polydimethylsiloxane, an elastomer including substituted or unsubstituted butadiene moiety such as styrene-ethylene-butylene-styrene, an elastomer including a urethane moiety, an elastomer including an acrylic moiety, an elastomer including an olefin moiety, or a combination thereof, but is not limited thereto. The inorganic elastomer-like material may include an elastic ceramic, an elastic solid metal, liquid metal, or a combination thereof, but is not limited thereto.

Referring to FIG. 3, the substrate 110 may include regions having different stiffness, in some example embodiments, a first region 110A having relatively high stiffness (e.g., a first stiffness) and a second region 110B having a relatively low stiffness than the first region 110A (e.g., having a second stiffness, where the second stiffness is lower than the first stiffness). Herein, the stiffness (e.g., first and/or second stiffness) may indicate a degree of resistance to deformation when a force is applied from the outside. Relatively high stiffness (e.g., the first stiffness) may mean that the resistance to deformation is relatively large, so that deformation is small, while relatively low stiffness (e.g., the second stiffness) may mean that the resistance to deformation is relatively small, so that the deformation is large.

The stiffness may be evaluated from an elastic modulus (e.g., a particular stiffness or range thereof may correspond to a particular elastic modulus or range thereof), and a high elastic modulus may mean high stiffness and a low elastic modulus may mean low stiffness. The elastic modulus may be, in some example embodiments, a Young's modulus, in some example embodiments, at a room temperature (about 25° C.). A difference between elastic moduli of the first region 110A and the second region 110B of the substrate 110 may be about 100 times or more, and the elastic modulus of the first region 110A may be about 100 times higher than the elastic modulus of the second region 110B (e.g., an elastic modulus of the first region 110A may be greater than an elastic modulus of the second region 110B by a factor equal to or greater than about 100). The difference between the elastic modulus of the first region 110A and the second region 110B may be about 100 to 100,000 times within the above range, and the elastic modulus of the first region 110A may be about 100 times to about 100,000 times higher than the elastic modulus of the second region 110B (e.g., an elastic modulus of the first region 110A may be greater than an elastic modulus of the second region 110B by a factor equal to or greater than about 100 and less than or equal to about 100,000), but is not limited thereto. In some example embodiments, the elastic modulus of the first region 110A may be about $10^7$ Pa to about $10^{12}$ Pa, and the elastic modulus of the second region 110B may be greater than or equal to about $10^2$ Pa and less than about $10^7$ Pa, but is not limited thereto. For example, a first region 110A having a first stiffness may have an elastic modulus of about $10^7$ Pa to about $10^{12}$ Pa, and a second region 110B having a second stiffness that is lower than the first stiffness may have an elastic modulus of about greater than or equal to about $10^2$ Pa and less than about $10^7$ Pa and which is smaller than the elastic modulus of the first region 110A. Therefore, it will be understood that a substrate having a first region having a first stiffness and a second region having a second stiffness that is lower than the first stiffness may mean a substrate having a first region having a first elastic modulus and a second region having a second elastic modulus that is smaller than the first elastic modulus.

Elongation rates of the first region 110A and the second region 110B of the substrate 110 may be different from each other due to the aforementioned difference in stiffness, and the elongation rate of the second region 110B may be higher than the elongation rate of the first region 110A. Herein, the elongation rate may be a percentage of the length change that is increased to a breaking point with respect to the initial length. In some example embodiments, the elongation rate of the first region 110A of the substrate 110 may be less than or equal to about 5%, within the range, about 0% to about 5%, about 0% to about 4%, about 0% to about 3%, about 0% to about 2%, about 0% to about 1%, about 0.5% to about 5%, about 0.5% to about 4%, about 0.5% to about 3%, about 0.5% to about 2%, or about 1% to about 2%. In some example embodiments, the elongation rate of the second region 110B of the substrate 110 may be greater than or equal to about 10%, within the range, about 10% to about 1000%, about 10% to about 800%, about 10% to about 700%, about 10% to about 500%, about 10% to about 300%, about 10% to about 200%, about 10% to about 100%, about 10% to about 90%, about 10% to about 80%, about 10% to about 70%, about 10% to about 60%, about 10% to about 50%, about 10% to about 40%, about 20% to about 70%, about 20% to about 60%, about 20% to about 50%, or about 20% to about 40%. Therefore, it will be understood that a substrate having a first region having a first stiffness and a second region having a second stiffness that is lower than the first stiffness may mean a substrate having a first elongation rate and a second region having a second elongation rate that is higher than the first elongation rate.

A plurality of first regions 110A of the substrate 110 may have an island-shape separated from each other (e.g., a plurality of island structures isolated from direct contact with each other), and a matrix arrangement may be repeatedly arranged along a row and/or column to correspond to the pixels PXs of the stretchable device 200. However, the arrangement of the plurality of first regions 110A of the substrate 110 is not limited thereto, and may be changed according to the arrangement of the pixels PXs. A unit device 150A, which will be described later, is disposed on each first region 110A of the substrate 110.

While the example embodiments shown in at least FIGS. 1-3 illustrate a stretchable device 200 where the substrate 110 includes multiple first regions 110A and a surrounding second region 110B, example embodiments are not limited thereto. For example, in some example embodiments, the stretchable device may include a single first region 110A and a single second region 110B that is adjacent to, and which may partially or completely surround, the first region 110A. Such a stretchable device 200 may include a single unit device 150A on the first region 110A.

The second region 110B of the substrate 110 may be a region other than the plurality of first regions 110A, and may be continuously connected entirely (e.g., may be a single, continuous structure within the substrate 110, or a single piece of material, that surrounds multiple separate first regions 110A in the substrate 110). For example, where the substrate 110 includes a plurality of first regions 110A (e.g., first regions 110A having island structures and isolated from direct contact with each other), the second region 110B may be between adjacent first regions 110A (e.g., the second region 110B may be a single region that is between some or all adjacent first regions 110A of the substrate 110). The second region 110B of the substrate 110 may be a region providing stretchability to the stretchable device 200. Due to the relatively low stiffness and high elongation rate of the second region 110B, the substrate 110 may flexibly respond to external forces or external movements such as twisting, pressing and/or pulling, and may be easily restored to its original state.

In some example embodiments, the first region 110A of the substrate 110 may have different shapes from the second region 110B of the substrate 110. In some example embodiments, the first region 110A of the substrate 110 may be flat and the second region 110B may include a two-dimensional or three-dimensional stretchable structure. The two-dimensional or three-dimensional stretchable structure may have, in some example embodiments, a wavy shape, a wrinkle shape, a popup shape, or a non-coplanar mesh shape, but is not limited thereto.

In some example embodiments, the first region 110A of the substrate 110 may include different materials from the second region 110B. In some example embodiments, the first region 110A of the substrate 110 may include inorganic, organic, and/or organic-inorganic materials having relatively high stiffness and a low elongation rate, and the second region 110B of the substrate 110 may include inorganic, organic, and/or organic-inorganic materials having a relatively low stiffness and high elongation rate. In some example embodiments, the first region 110A of the substrate 110 may include an organic material including polycarbonate, polymethylmethacrylate, polyethyleneterephthalate, polyethylenenaphthalate, polyimide, polyamide, polyamide-imide, polyethersulfone, or a combination thereof; a carbon structure such as diamond carbon, or a combination thereof, and the second region 110B of the substrate 110 may include an organic or organic-inorganic elastomer including a substituted or unsubstituted polyorganosiloxane such as polydimethylsiloxane, an elastomer including a substituted or unsubstituted butadiene moiety such as styrene-ethylene-butylene-styrene, an elastomer including a urethane moiety, an elastomer including an acrylic moiety, an elastomer including an olefin moiety, or a combination thereof; an inorganic elastomer-like material such as an elastic ceramic, an elastic solid metal, a liquid metal, or a combination thereof, but is not limited thereto. In some example embodiments, the first and second regions 110A and 110B may be bonded together, for example via application of an epoxy, and/or may be at least partially welded together.

In some example embodiments, the first region 110A and the second region 110B of the substrate 110 may be formed with the same material (e.g., may be part of a single piece of material), and may be at least partially defined as separate regions that have different stiffness by different conditions such as polymerization degrees and/or curing degrees. In some example embodiments, the substrate 110 may include the first region 110A having a relatively high stiffness and the second region 110B having a relatively low stiffness which are formed by varying the polymerization degrees, types and contents of curing agents, and/or curing temperatures, based on polydimethylsiloxane (e.g., based on varying application of one or more curing agents and/or curing temperatures on different regions of a single piece of polydimethylsiloxane material).

The transistor 120 and the connecting electrode 130 are formed on the substrate 110. The transistor 120 may be on the first region 110A of the substrate 110, on the second region 110B of the substrate 110, or on both the first region 110A and the second region 110B of the substrate 110. The connecting electrode 130 may be on the first region 110A of the substrate 110, on the second region 110B of the substrate 110, or on both the first region 110A and the second region 110B of the substrate 110. When the transistor 120 is on the second region 110B of the substrate 110, the transistor 120 may be a stretchable transistor.

One or two or more transistors 120 may be included in each pixel PX, and may be connected to a plurality of signal lines (not shown). The plurality of signal lines may include a gate line for transmitting a gate signal (or scan signal), a data line for transmitting a data signal, and a driving voltage line for transmitting a driving voltage. At least a portion of the plurality of signal lines may be stretchable wires.

The transistor 120 may include, in some example embodiments, a switching transistor and/or a driving transistor. The switching transistor may be electrically connected to the gate line and the data line and may include a first gate electrode connected to the gate line; a first source electrode connected to the data line; a first drain electrode facing the first source electrode; and a first semiconductor which is respectively electrically connected to the first source electrode and the first drain electrode. The driving transistor may include a second gate electrode electrically connected to the first drain electrode; a second source electrode connected to the driving voltage line; a second drain electrode facing the second source electrode; and a second semiconductor which is respectively electrically connected to the second source electrode and the second drain electrode. In some example embodiments, the first semiconductor and the second semiconductor may each include a semiconductor material and an elastomer. In some example embodiments, the first semiconductor and the second semiconductor may each include an organic semiconductor material and an elastomer.

The connecting electrode 130 may be electrically connected to a plurality of common electrodes 152A, which will be described later, and may be electrodes to which a common voltage is applied for the operation of the unit device 150A. The connecting electrode 130 may be on the second region 110B of the substrate 110 or may be disposed on both the first region 110A and the second region 110B of the substrate 110. The connecting electrode 130 may be a single, continuous electrode that is connected to each common electrode 152A of the plurality of common electrodes 152A (e.g., the connecting electrode 130 may be a single piece of material). As shown in at least FIG. 1, the connecting electrode 130 may have a wave shape such that, while the cross-sectional view shown in at least FIG. 2 shows separate portions of the connecting electrode 130 connected to separate common electrodes 152A, said separate portions of the connecting electrode 130 are part of a single, continuous (e.g., single-piece) connecting electrode 130 that is connected (e.g., electrically connected) to each common electrode 152A.

The connecting electrode 130 may be a stretchable electrode and, in some example embodiments, may include a stretchable conductor or may have a stretchable wave shape. The stretchable conductor may include, in some example embodiments, conductive nanostructures, for example conductive nanoparticles, conductive nanoflakes, conductive nanowires, conductive nanotubes, or combinations thereof, for example nanoparticles, nanoflakes, nanowires, nanotubes or combinations thereof, including a low-resistance conductor such as silver, gold, copper, aluminum, etc., or carbon conductors, such as silver nanoparticles, silver nanoflakes, silver nanowires, silver nanotubes, graphene, graphite, or combinations thereof, but is not limited thereto. When the connecting electrode 130 has the stretchable wave shape, the connecting electrode 130 may include a low-resistance conductor such as silver, gold, copper, aluminum, an alloy thereof, or a combination thereof.

The insulation layer 140 is formed on the transistor 120 and the connecting electrode 130. The insulation layer 140 may include an organic, inorganic, or organic-inorganic insulating material, in some example embodiments, an inorganic insulating material such as silicon oxide, silicon nitride, or silicon oxynitride; an organic insulating material such as polyimide; or an organic-inorganic insulating material such as polyorganosiloxane or polyorganosilazane. The insulation layer 140 may be a stretchable insulation layer and may include, in some example embodiments, an elastomer. The elastomer may include the aforementioned organic elastomer, organic-inorganic elastomer, inorganic elastomer-like material or combination thereof, but is not limited thereto. The insulation layer 140 has a plurality of contact holes 142 exposing the transistor 120.

The unit device array 150 is formed on the insulation layer 140. The unit device array 150 may include a plurality of unit devices 150A that are repeatedly arranged along rows and/or columns, and each unit device 150A of the plurality of unit devices 150A may be disposed on the first region 110A of the substrate 110. Where the substrate 110 includes a plurality of first regions 110A, the unit device array 150 may include a plurality of unit devices 150A that are on separate, respective first regions 110A of the plurality of first regions 110A of the substrate 110. Each unit device 150A may be, in some example embodiments, a diode or a transistor, and may be, in some example embodiments, a diode.

The unit device array 150 may include a plurality of pixel electrodes 151A respectively isolated on a plurality of first regions 110A (e.g., isolated on separate, respective first regions 110A) of the substrate 110; a plurality of common electrodes 152A respectively isolated on the plurality of first regions 110A (e.g., isolated on separate, respective first regions 110A) of the substrate 110 and facing the plurality of the pixel electrodes 151A (e.g., each separate common electrode 152A faces a separate pixel electrode 151A of the plurality of pixel electrodes 151A); and a plurality of active layers 153A between the plurality of pixel electrodes 151A and the plurality of common electrodes 152A (e.g., each separate active layer 153A being between a separate pixel electrode 151A and a separate common electrode 152A) and on the plurality of first regions 110A (e.g., each separate active layer 153A being on separate, respective first regions 110A) of the substrate 110.

The pixel electrodes 151A may be repeatedly arranged along rows and/or columns to form a pixel electrode array, the common electrodes 152A may be repeatedly arranged along rows and/or columns to form a common electrode array, and the active layers 153A may be repeatedly arranged along rows and/or columns to form an active layer array.

The unit device 150A including the pixel electrodes 151A, the common electrodes 152A, and the active layers 153A may be on the first region 110A of the substrate 110 having a relatively high stiffness, and the unit device 150A may not be on the second region 110B having a relatively low stiffness of the substrate 110. Therefore, the unit device 150A including the pixel electrodes 151A, the common electrodes 152A, and the active layers 153A is not substantially affected by external force or external movement such as twisting, pressing, and/or pulling the stretchable device 200. Accordingly, materials for improving the performance of the pixel electrodes 151A, the common electrodes 152A, and the active layers 153A may be freely selected, and damage or destruction caused by tensile deformation due to external force or external movement may be reduced or prevented.

Each of the pixel electrodes 151A and the common electrodes 152A may be independently made of a low-resistance conductor, in some example embodiments, a metal, a conductive oxide, and/or a conductive organic material. In some example embodiments, the pixel electrodes 151A and the common electrodes 152A may be independently made of a metal such as aluminum, silver, gold, copper, magnesium, nickel, molybdenum, or an alloy thereof; a conductive oxide such as indium tin oxide (ITO), indium zinc oxide (IZO), zinc tin oxide (ZTO), aluminum tin oxide (ATO), and aluminum zinc oxide (AZO); and/or a conductive organic material such as polyacetylene (PA), polypyrrole (PPy), polythiophene (PT), polyaniline (PA), and poly(3,4-ethylenedioxythiophene).

The pixel electrodes 151A and the common electrodes 152A may be transparent or opaque electrodes, respectively. The transparent electrode may have a transmittance of greater than or equal to about 80% and may include a metal thin film or the aforementioned conductive oxide, conductive organic material, and/or carbon conductor, and the opaque electrode may have, in some example embodiments, a transmittance of less than about 10% or a reflectance of greater than or equal to about 5%, and may include a metal.

Each pixel electrode 151A may be electrically connected to the transistor 120 in each pixel PX, and may be driven independently for each pixel PX. The plurality of common electrodes 152A are electrically connected to the connecting electrode 130, and a common voltage (e.g., a same voltage) may be applied to each of the common electrodes 152A based on a particular voltage (in some example embodiments, a reference voltage) being applied to the connecting electrode 130 to which each of the common electrodes 152A are connected. Accordingly, it will be understood that the stretchable device 200 according to some example embodiments is configured to apply a common voltage (e.g., same voltage) to the common electrodes 152A (e.g., apply the same voltage to the common electrodes 152A simultaneously or substantially simultaneously). It will be understood that, in some example embodiments, the stretchable device 200 includes a plurality of connecting electrodes 130 (e.g., multiple, separate pieces of material that may be at least partially isolated from direct contact with each other) that are connected to separate, respective sets of common electrodes 152A and the stretchable device 200 is configured to enable a common voltage (e.g., same voltage) to be applied to the common electrodes 152A based on a common voltage being applied to the plurality of connecting electrodes 130 (e.g., via the common voltage being applied to a single-piece connecting circuit that is electrically connected to each connecting electrode 130.

The active layer 153A may include a light emitting layer or a photoelectric conversion layer.

The light emitting layer may include an organic material, an inorganic material, an organic-inorganic material, or a combination thereof configured to emit light, in some example embodiments, an organic light emitting material, an inorganic light emitting material, a quantum dot, a perovskite, or a combination thereof, but is not limited thereto.

When the light emitting layer includes an organic light emitting material, the unit device 150A may be an organic light emitting diode. When the light emitting layer includes an inorganic light emitting material, the unit device 150A may be an inorganic light emitting diode.

When the light emitting layer includes quantum dots, the unit device 150A may be a quantum dot light emitting diode. When the light emitting layer includes a perovskite, the unit device 150A may be a perovskite light emitting diode.

The photoelectric conversion layer may be configured to selectively absorb at least a portion of wavelength spectrum and convert the absorbed light into an electric signal, and may be configured to absorb for example at least one of light in a blue wavelength spectrum (hereinafter, referred to as "blue light"), light in a green wavelength spectrum (hereinafter, referred to as "green light"), light in a red wavelength spectrum (hereinafter, referred to as "red light"), or light in an infrared wavelength spectrum (hereinafter, referred to as "infrared light") into an electric signal.

In some example embodiments, the photoelectric conversion layer may be configured to selectively absorb one of the blue light, green light, red light, or infrared light and may convert the absorbed light into an electric signal. Herein, the selective absorption of one from the blue light, green light, red light, and infrared light means that an absorption spectrum has a maximum absorption wavelength ($\lambda_{max}$) of greater than or equal to about 380 nm and less than about 500 nm, about 500 nm to about 600 nm, greater than about 600 nm and less than or equal to about 700 nm, and greater than about 700 nm and to less than or equal to about 3000 nm, and an absorption spectrum in the corresponding wavelength spectrum is significantly higher than those in the other wavelength spectrums. Herein, "significantly higher" may mean that about 70% to about 100%, about 75% to about 100%, about 80% to about 100%, about 85% to about 100%, about 90% to about 100% or about 95% to about 100% of the total area of the absorption spectrum may be for example belong to the corresponding wavelength spectrum.

The photoelectric conversion layer may include a p-type semiconductor and an n-type semiconductor to form a pn junction, at least one of the p-type semiconductor or the n-type semiconductor may be a light absorbing material, and at least one of the p-type semiconductor or the n-type semiconductor may be a wavelength-selective light absorbing material. In some example embodiments, at least one of the p-type semiconductor or the n-type semiconductor may have a maximum absorption wavelength ($\lambda$max) in a wavelength spectrum of greater than or equal to about 380 nm and less than 500 nm, about 500 nm to about 600 nm, greater than about 600 nm and less than or equal to about 700 nm, and greater than about 700 nm to less than or equal to about 3000 nm. The p-type semiconductor and the n-type semiconductor may have peak absorption wavelengths ($\lambda$max) in the same or different wavelength spectrums. The p-type semiconductor and the n-type semiconductor may be an organic material, an inorganic material, or an organic-inorganic material, respectively. In some example embodiments, at least one of the p-type semiconductor or the n-type semiconductor may be an organic material.

The unit device 150A may further include an auxiliary layer (not shown) between the pixel electrodes 151A and the active layers 153A and/or between the common electrodes 152A and the active layers 153A. The auxiliary layer may be, in some example embodiments, a charge auxiliary layer, a light emitting auxiliary layer and/or an absorbing auxiliary layer. The charge auxiliary layer may be one or more layers selected from, in some example embodiments, a hole injection layer, a hole transport layer, an electron blocking layer, an electron injection layer, an electron transport layer, and a hole blocking layer. The auxiliary layers may each independently include an organic material, an inorganic material, or an organic-inorganic material.

The pixel definition layer 160 may be formed on a whole surface of the insulation layer 140, and may be a continuous film having a plurality of openings 161 and via holes 162. As shown, the pixel definition layer 160 may be at least partially between (e.g., between in the horizontal direction extending parallel to the substrate 110) adjacent unit devices 150A of the unit device array 150. The plurality of openings 161 may be disposed on the first region 110A of the substrate 110 to define each pixel PX and expose each unit device 150A. In some example embodiments, the shape and size of each pixel PX may be determined according to the shape and size of each opening 161. The plurality of via holes 162 may be a passage electrically connecting the common electrodes 152A to the connecting electrode 130, and may be filled with a conductor that is the same as or different from the conductor forming the common electrodes 152A. Accordingly, the pixel definition layer 160 may be understood to have via holes 162 corresponding to separate, respective unit devices 150A and/or separate, respective pixels PX. The pixel definition layer 160 may be understood to have openings 161 corresponding to separate, respective unit devices 150A and/or corresponding to (e.g., at least partially defining) separate, respective pixels PX. As shown in FIG. 2, the pixels PX may be defined by the horizontal outer boundaries of the sidewalls (e.g., sloped sidewalls) of the openings 161 (e.g., the edges between the sidewalls of the openings 161 and the upper surface of the pixel definition layer 160). In some example embodiments, the pixels PX may be defined by the horizontal inner boundaries of the sidewalls of the openings 161 (e.g., the edges between the sidewalls of the openings 161 and upper surfaces of corresponding common electrodes 151A exposed by the respective openings 161).

It will be understood that, in some example embodiments, the pixel definition layer 160 may be absent from the stretchable device 200. In some example embodiments, the aforementioned openings 161 may be at least partially formed (e.g., as depressions) in the upper surface of the insulation layer 140 when the pixel definition layer 160 is absent, to define the pixels PX and upon which at least the pixel electrodes 151A and/or the entire unit devices 150A may be located (e.g., separate unit devices 150A on separate depressions in the insulation layer 140), and via holes 162 and contact holes 142 may extend through the insulation layer 140 as described and shown in the figures.

The pixel definition layer 160 may include an organic, inorganic, and/or organic-inorganic insulating material, for example an inorganic insulating material such as silicon oxide, silicon nitride, or silicon oxynitride; an organic insulating material such as polyimide; or an organic-inorganic insulating material, such as polyorganosiloxane or polyorganosilazane. The pixel definition layer 160 may be a stretchable insulation layer, and may include, in some example embodiments, an elastomer. The elastomer may include the aforementioned organic elastomer, organic-inorganic elastomer, inorganic elastomer-like material or combination thereof, but is not limited thereto.

The encapsulant 170 may be isolated separately on the first region 110A of the substrate 110, and each encapsulant 170 may individually cover each unit device 150A or each pixel PX, such that the encapsulant 170 covers the unit device array 150. Restated, where the substrate 110 includes a plurality of first regions 110A, the encapsulant 170 may include a plurality of separate encapsulants 170S (which may be isolated from direct contact with each other), where the plurality of encapsulants 170S are on separate, respective unit devices 150A and which are on, and overlap in a vertical direction extending perpendicular to the substrate 110, separate, respective first regions 110A of the plurality of first regions 110A. Accordingly, as shown in FIG. 2, the plurality of encapsulants 170S may cover separate, respective unit devices 150A from at least vertical exposure. While side edges of the common electrodes are exposed by the encapsulants 170S as shown in FIG. 2, it will be understood that in some example embodiments the encapsulants 170S may completely cover, in both vertical and side directions, separate, respective underlying unit devices 150A, including side edges of respective common electrodes 152A thereof (e.g., as shown in at least FIG. 16). The adjacent encapsulants 170S are separated from each other (e.g., isolated from direct contact with each other) with the second region 110B of the substrate 110 disposed therebetween (e.g., the plurality of encapsulants 170 may not vertically overlap the second region 110B, e.g., overlap the second region 110B in the direction extending perpendicular to the substrate 110). In some example embodiments, the encapsulant 170 (e.g., the plurality of encapsulants 170S) may have the same planar shape as the common electrodes 152A.

As described above, the encapsulant 170 is formed to individually cover each unit device 150A or each pixel PX on the first region 110A of the substrate 110 (e.g., the encapsulant 170 may include a plurality of encapsulants 170S that are isolated from direct contact with each other, and each separate encapsulant 170S is configured to cover a separate unit device 150A or pixel PX), thereby the encapsulant 170 may not be substantially affected by an external force or external movement such as twisting, pressing, and/or pulling the stretchable device 200, and accordingly, materials for improving the performance of the encapsulant 170 may be freely selected, and damages or destruction caused by tensile deformation due to external force or external movement may be reduced or prevented.

The encapsulant 170 may include, in some example embodiments, an organic material, an inorganic material, and/or an organic/inorganic material, and may include one or more layers. In some example embodiments, the encapsulant 170 may include an oxide, a nitride, and/or an oxynitride, such as an oxide, a nitride, and/or an oxynitride including aluminum (Al), titanium (Ti), zirconium (Zr), hafnium (Hf), tantalum (Ta), silicon (Si), or a combination thereof. In some example embodiments, the encapsulant 170 may include layers having different refractive indexes that are alternately stacked. In some example embodiments, a first layer including a first material selected from an oxide, a nitride, and an oxynitride, and a second layer including a second material selected from an oxide, a nitride, and an oxynitride having a higher refractive index than the first material may be alternately stacked.

The encapsulant 170 may protect the unit device 150A and effectively block or prevent the inflow of oxygen, moisture, and/or contaminants from the outside. In some example embodiments, when the stretchable device 200 is included in a display device or biological device attached to a living body, the encapsulant 170 may prevent the inflow of biological secretions such as sweats into the stretchable device 200 and thus prevent from degradation of the stretchable device 200.

In this way, the stretchable device 200 according to some example embodiments includes the substrate 110 including the first region 110A having relatively high stiffness and a relatively low elongation rate and the second region 110B having relatively low stiffness and a high elongation rate and thus may flexibly respond to an external force or external movement such as twisting, pressing, and/or pulling in a particular (or, alternatively, predetermined) direction.

In addition, since the stretchable device 200 according to some example embodiments includes the unit device 150A disposed on the first region 110A of the substrate 110, materials for improving performance of constituent elements of the unit device 150A may be freely selected, and when the substrate 110 is stretched by an external force or external movement, the unit device 150A may be prevented from tensile deformation and thus from damage or destruction.

In addition, the stretchable device 200 according to some example embodiments may prevent or reduce destruction or damage of the common electrode 152A and the encapsulant 170, when the substrate 110 is stretched by an external force or external movement, by not continuously but separately isolating the common electrode 152A and the encapsulant 170 in each unit device 150A. Accordingly, the materials for improving performance of the common electrode 152A and the encapsulant 170 may be freely selected, and accordingly, the stretchable device 200 may be effectively realized without performance degradation of the common electrode 152A and the encapsulant 170.

Hereinafter, some example embodiments of a method of producing the stretchable devices of FIGS. 1 and 2 is described with reference to the drawings.

FIGS. 4, 5, 6, 7, 8, 9, 10, 11, and 12 are cross-sectional views sequentially showing some example embodiments of a method of manufacturing the stretchable devices of FIGS. 1 and 2.

Figure 4:
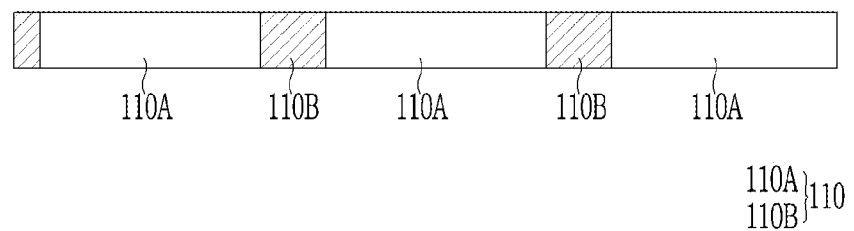
FIGS. 4, 5, 6, 7, 8, 9, 10, 11, and 12 are cross-sectional views sequentially showing examples of a method of producing the stretchable devices of FIGS. 1 and 2 according to some example embodiments.

Referring to FIG. 4 along with FIG. 3, a substrate 110 including a first region 110A having relatively high stiffness and a relatively low elongation rate and a second region 110B having relatively low stiffness and a relatively high elongation rate is prepared. The first region 110A of the substrate 110 may be repeatedly arranged along rows and/or columns into an island-shape and disposed at a position where a unit device 150A will be formed. The second region 110B of the substrate 110 may be a region other than the first region 110A and may be continuously connected thereto.

The first region 110A and the second region 110B of the substrate 110 may be formed in various methods for varying stiffness and elongation rates but are not limited to a particular method.

In some example embodiments, after setting positions for the first region 110A and the second region 110B of the substrate 110, a two-dimensional or three-dimensional stretchable structure may be disposed on the positions for the second region 110B of the substrate 110. The two-dimensional or three-dimensional stretchable structure may have, in some example embodiments, a wavy shape, a wrinkle shape, a popup shape, or a non-coplanar mesh shape, but is not limited thereto. In some example embodiments, the two-dimensional or three-dimensional structure may be implemented by imprinting or photolithography, but is not limited thereto.

In some example embodiments, after preparing the substrate 110 including an elastomer having relatively low stiffness and a relatively high elongation rate, a structure including a material having relatively high stiffness and a relatively low elongation rate is selectively disposed on the positions where the first region 110A will be formed to provide a plurality of first regions 110A. The material having relatively high stiffness and relatively low elongation rate may be, in some example embodiments, an organic material such as polycarbonate, polymethyl methacrylate, polyethylene terephthalate, polyethylene naphthalate, polyimide, polyamide, polyamideimide, polyether sulfone, or a combination thereof, a carbon structure such as diamond carbon, but is not limited thereto. Herein, the region where the structure is not disposed may be the second region 110B of the substrate 110.

In some example embodiments, after setting the positions for forming the first region 110A and the second region 110B of the substrate 110, types of base polymers, polymerization degrees, and/or curing degrees may be changed to form the first region 110A and the second region 110B having different stiffness and elongation rates on the positions where the first region 110A and the second region 110B of the substrate 110 will be formed.

In some example embodiments, stiffness of the substrate 110 may be different by using polydimethylsiloxane (PDMS) as a base polymer but changing a polymerization degree of a polymer chain consisting of Si—O bonds.

In some example embodiments, the stiffness of the substrate 110 may be different by using the polydimethylsiloxane (PDMS) as a base polymer but changing types of and the number of side chains linked to the polydimethylsiloxane (PDMS).

In some example embodiments, the stiffness of the substrate 110 may be different by using the polydimethylsiloxane (PDMS) as a base polymer but adjusting a composition ratio of the polydimethylsiloxane and a curing agent. As an amount of the curing agent is increased, the stiffness may be increased, in some example embodiments, the amount of the curing agent relative to that of the base polymer on the position where the first region 110A of the substrate 110 will be formed may be larger than the amount of the curing agent relative to that of the base polymer on the position where second region 110B of the substrate 110 will be formed.

In some example embodiments, the stiffness of the substrate 110 may be different by using the polydimethylsiloxane (PDMS) as a base polymer but changing a curing temperature and/or time. As the curing temperature is higher, and the curing time is longer, the stiffness may be higher, in some example embodiments, the curing temperature at the position where the first region 110A of the substrate 110 will be formed may be higher than the curing temperature at the position where the second region 110B of the substrate 110 will be formed, and in some example embodiments, the curing time at the position where the first region 110A of the substrate 110 will be formed may be longer than the curing time at the position where the second region 110B of the substrate 110 will be formed.

Figure 5:
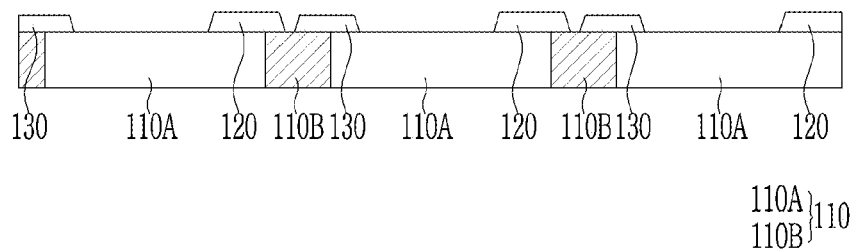

Referring to FIG. 5, a plurality of signal lines (not shown), the transistor 120, and the connecting electrode 130 are formed on the substrate 110. The connecting electrode 130 may be formed along with the signal lines but are not limited thereto.

Figure 6:
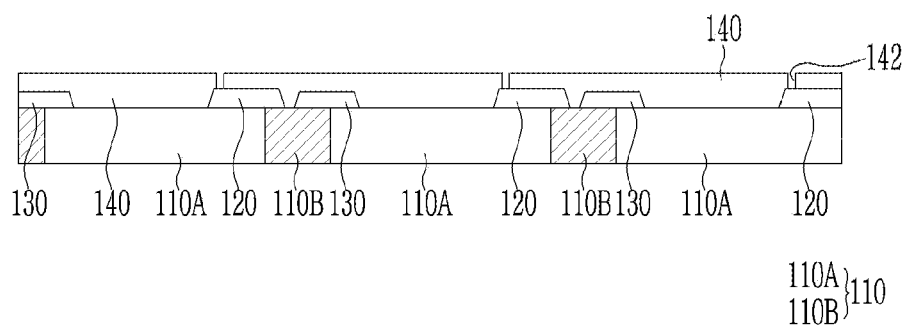

Referring to FIG. 6, the insulation layer 140 is formed on the whole surface of the substrate 110. The insulation layer 140 may be formed through coating, deposition, imprinting, and the like but is not limited thereto. The insulation layer 140 has a contact hole 142 exposing the transistor 120 of each pixel (PX).

Figure 7:
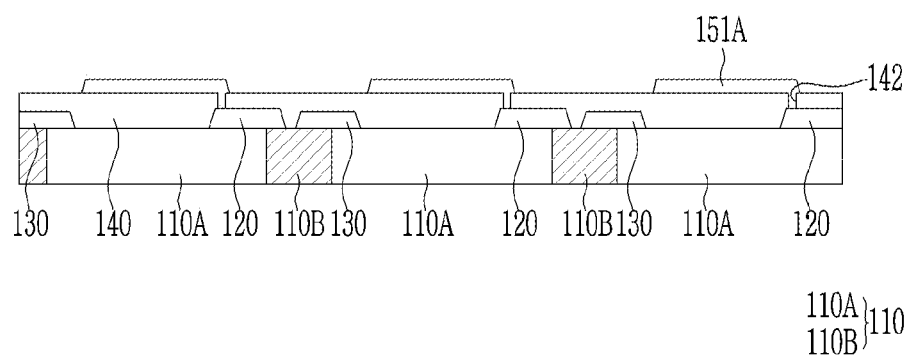

Referring to FIG. 7, a conductor for a pixel electrode is formed on the insulation layer 140 and then, photolithographed to form the pixel electrode 151A. Each pixel electrode 151A is formed in isolation in the first region 110A of the substrate 110 and electrically connected to the transistor 120 through the contact hole 142 of the insulation layer 140.

Figure 8:
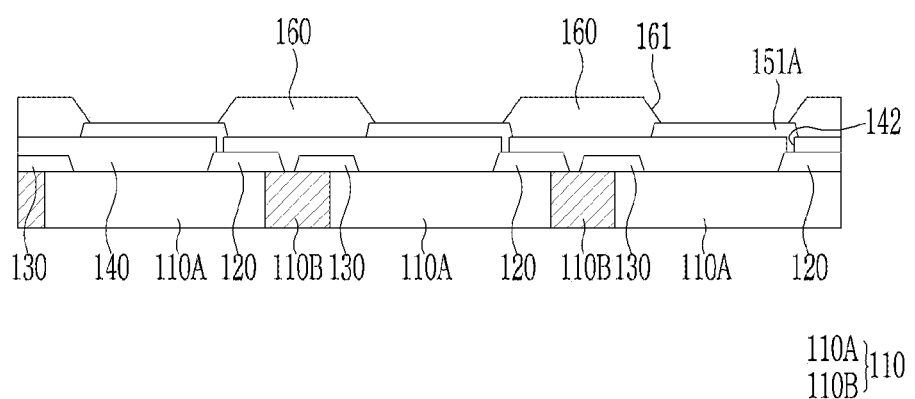

Referring to FIG. 8, an organic layer is formed on the whole surface of the insulation layer 140 and patterned to form a pixel definition layer 160 having a plurality of openings 161 exposing the pixel electrode 151A.

Figure 9:
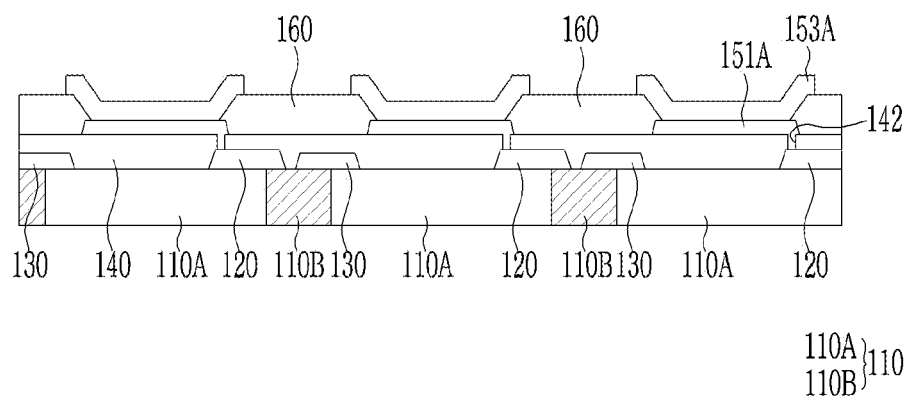

Referring to FIG. 9, the active layer 153A is formed on each pixel electrode 151A. The active layer 153A may be formed by coating, depositing or imprinting a light emitting material or a light absorbing material, but is not limited thereto.

In some example embodiments, the active layer 153A may be formed by disposing side by side or stacking in a vertical direction light emitting materials configured to emit light in different wavelength spectrums. In some example embodiments, in first, second, and third pixels arranged adjacently, the active layer 153A of the first pixel may include a light emitting material configured to emit light in a red wavelength spectrum, the active layer 153A of the second pixel may include a light emitting material configured to emit light in a green wavelength spectrum, and the active layer 153A of the third pixel may include a light emitting material configured to emit light in a blue wavelength spectrum.

In some example embodiments, the active layer 153A may be formed by disposing side by side (e.g., aligned in parallel with the substrate 110) or stacking in a vertical direction (e.g., in the direction perpendicular to the substrate 110) the light absorbing materials configured to absorb light in the different wavelength spectrums. In some example embodiments, in the first, second, and third pixels arranged adjacently, the active layer 153A of the first pixel may include a light absorbing material configured to emit light in the red wavelength spectrum, the active layer 153A of the second pixel may include a light absorbing material configured to emit light in the green wavelength spectrum, and the active layer 153A of the third pixel may include a light absorbing material configured to emit light in the blue wavelength spectrum.

Figure 10:
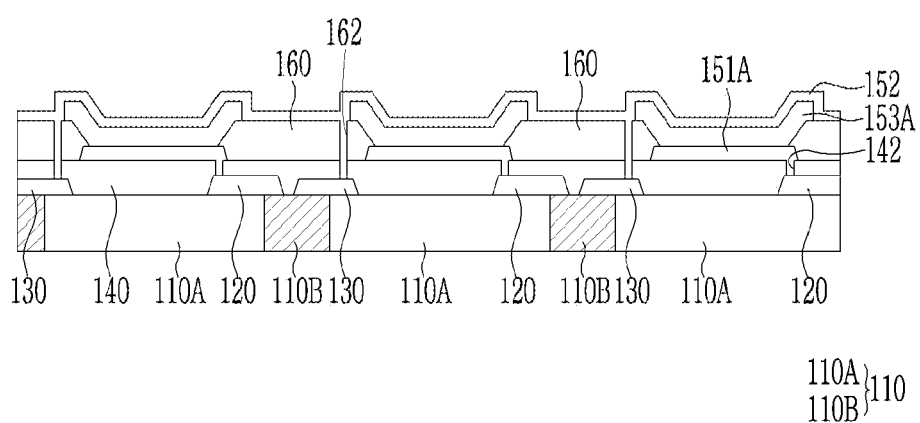

Referring to FIG. 10, via holes 162 exposing the connecting electrode 130 are formed in the pixel definition layer 160 and the insulation layer 140. Subsequently, the conductive layer 152 for a common electrode is formed on the whole surface of the pixel definition layer 160 and the active layer 153A. The conductive layer 152 for a common electrode is electrically connected to the connecting electrode 130 through the via hole 162 of the pixel definition layer 160. Accordingly, each common electrode 152A may be connected to the connecting electrode 130 through a separate via hole 162 of the pixel definition layer 160 (e.g., the via hole that corresponds to the respective unit device 150A that includes said common electrode 152A).

Figure 11:
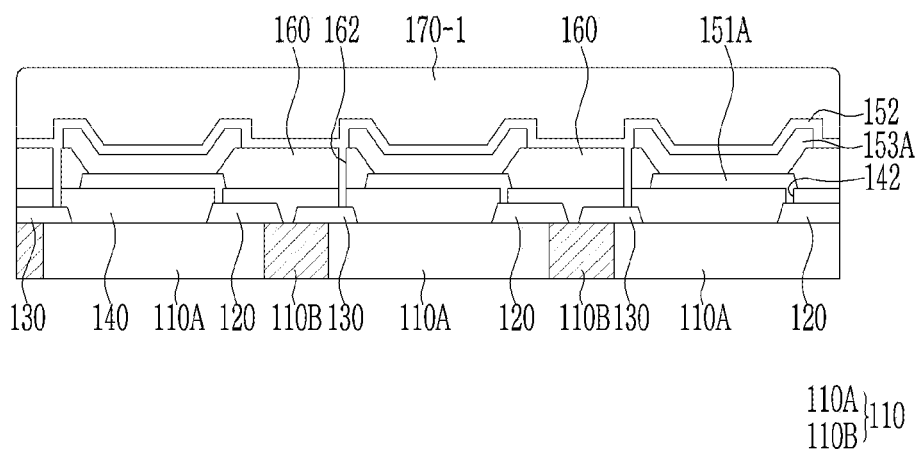

Referring to FIG. 11, a thin film 170-1 for an encapsulant is formed on the whole surface of the conductive layer 152 for a common electrode. The thin film 170-1 for an encapsulant may be formed in a method of coating, deposition, or imprinting, but is not limited thereto.

Figure 12:
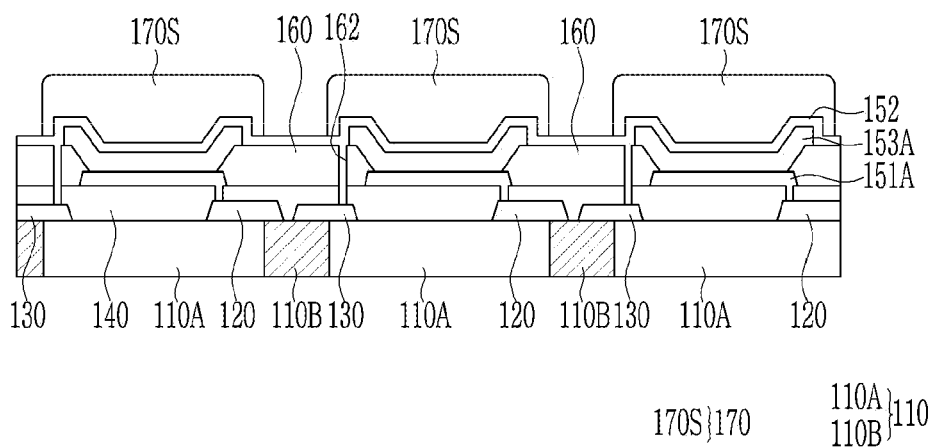

Referring to FIG. 12, the thin film 170-1 for an encapsulant is photolithographed to form the encapsulant 170 respectively isolated on the first region 110A of the substrate 110. The encapsulant 170 may individually cover each unit device 150A, and the adjacent encapsulant 170 be separated therefrom with the second region 110B of the substrate 110 therebetween.

Referring to FIG. 2, the conductive layer 152 for a common electrode is photolithographed using the encapsulant 170 as a mask to form a plurality of common electrodes 152A isolated on the first regions 110A of the substrate 110. Herein, since the encapsulant 170 is used as a mask to form the common electrode 152A, the encapsulant 170 and the common electrode 152A may have the substantially same planar shape. The photolithography may be wet etching or dry etching.

Hereinafter, some example embodiments of a method of manufacturing the stretchable devices of FIGS. 1 and 2 are illustrated.

FIGS. 13, 14, 15, and 16 are cross-sectional views sequentially showing some example embodiments of a method of manufacturing the stretchable devices of FIGS. 1 and 2.

First, as illustrated referring to FIGS. 4 to 9, a transistor 120, a connecting electrode 130, an insulation layer 140, a pixel definition layer 160, a pixel electrode 151A, and an active layer 153A are formed on a substrate 110 having first regions 110A and second regions 110B, as described above.

Figure 13:
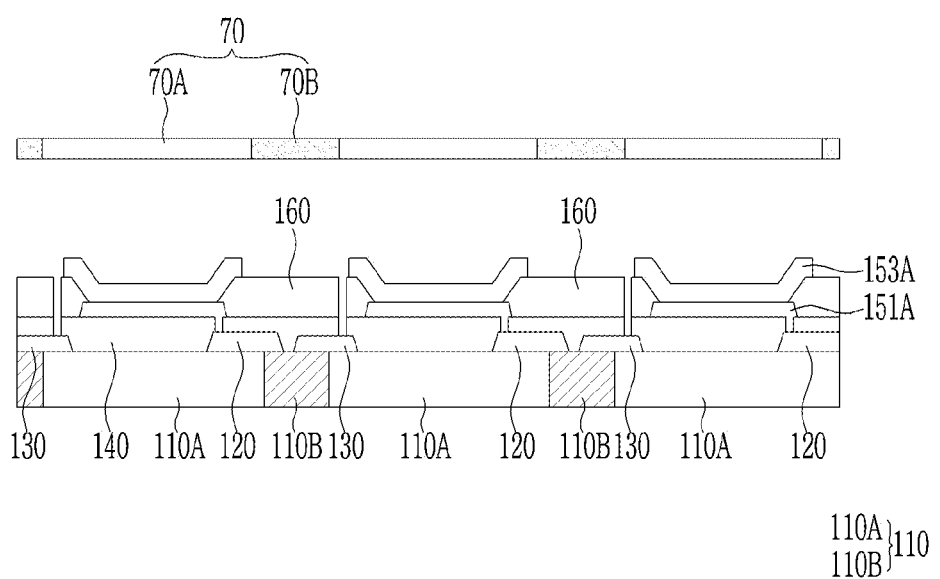
FIGS. 13, 14, 15, and 16 are cross-sectional views sequentially showing examples of a method of producing the stretchable devices of FIGS. 1 and 2 according to some example embodiments.
Figure 14:
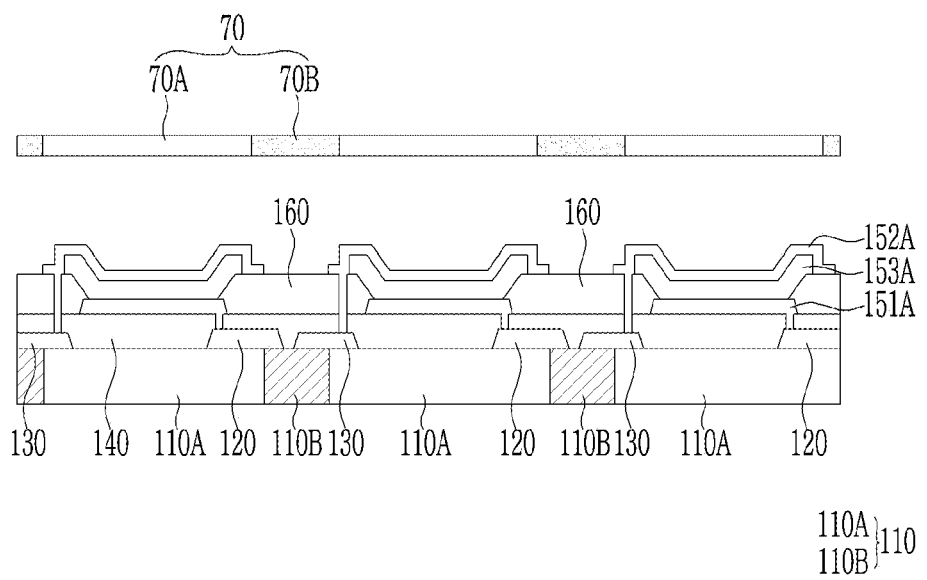

Referring to FIGS. 13 and 14, a mask 70 is disposed over the active layer 153A. The mask 70 may have a fine open portion 70A and a fine block portion 70B, and in some example embodiments, be a fine metal mask FMM. The fine open portion 70A of the mask 70 may substantially have the same size as that of a common electrode 152A. After disposing a source for supplying conductor on the mask 70, a conductor is selectively deposited on the fine open portion 70A of the mask 70 to form the common electrode 152A. Subsequently, the mask 70 is removed.

Figure 15:
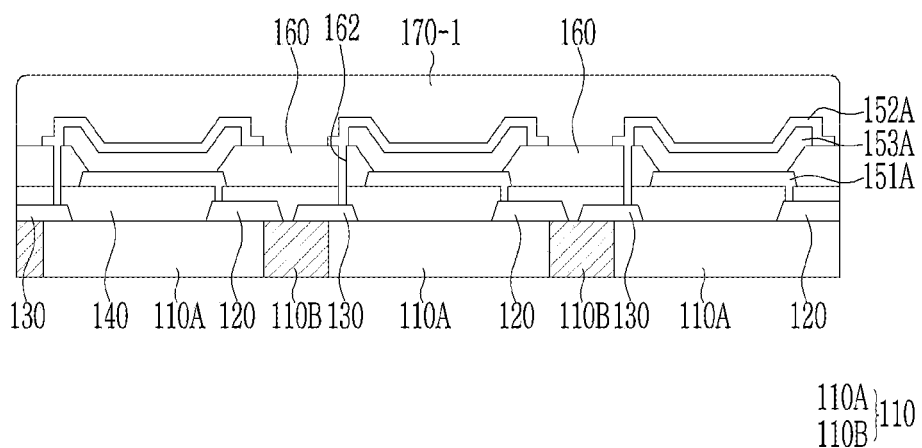

Referring to FIG. 15, on whole surface of the common electrode 152A and the pixel definition layer 160, the thin film 170-1 for an encapsulant is formed. The thin film 170-1 for an encapsulant may be formed in a method of coating, deposition, or imprinting, but is not limited thereto.

Figure 16:
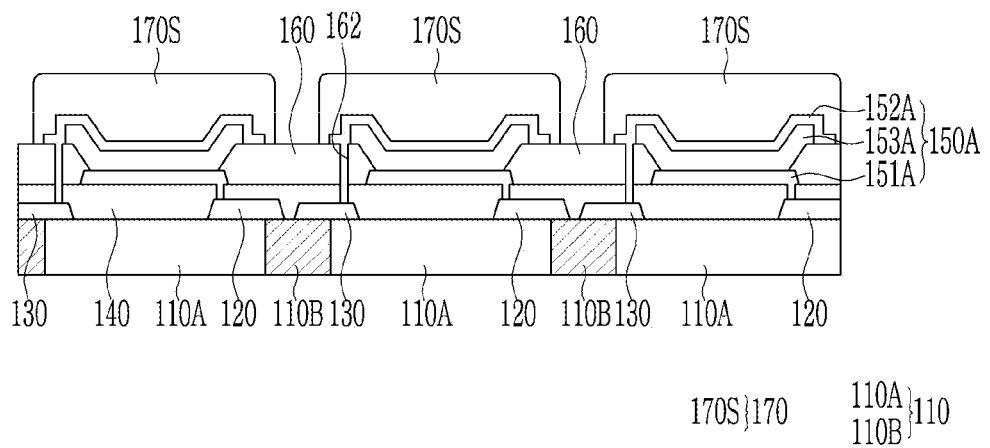

Referring to FIG. 16, the thin film 170-1 for an encapsulant is photolithographed to form encapsulants 170S respectively isolated on the first regions 110A of the substrate 110. The encapsulants 170S may individually cover each unit device 150A, and adjacent encapsulants 170S may be separated from each other with the second region 110B of the substrate 110 therebetween.

Hereinafter, another example of the stretchable device according to some example embodiments is described.

Figure 17:
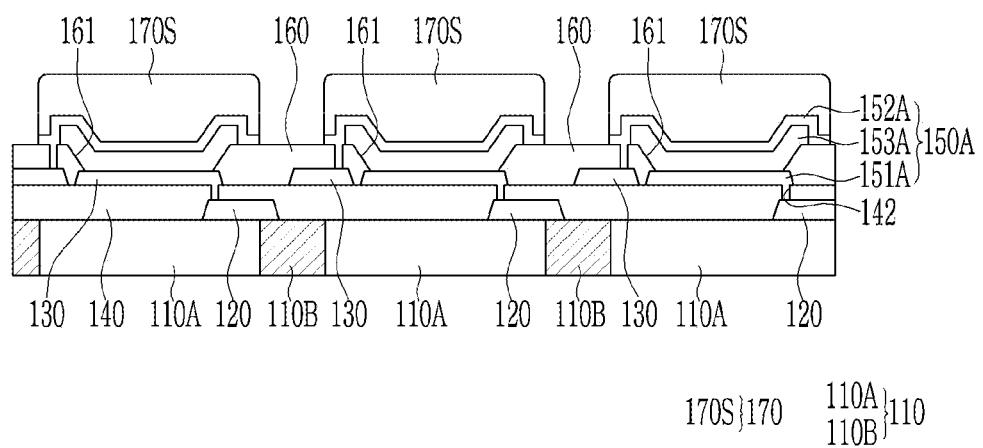
FIG. 17 is a cross-sectional view of another example of the stretchable device of FIG. 1 taken along line II-II' according to some example embodiments.

FIG. 17 is a cross-sectional view of some example embodiments of the stretchable device of FIG. 1 taken along line II-II'.

Referring to FIG. 17, the stretchable device 200 according to some example embodiments includes a substrate 110 having first regions 110A and second regions 110B; a transistor 120; a connecting electrode 130; an insulation layer 140; a plurality of unit devices 150A including a pixel electrode 151A, an active layer 153A, and a common electrode 152A; a pixel definition layer 160; and an encapsulant 170, like some example embodiments.

However, in the stretchable device 200 according to some example embodiments, including the example embodiments shown in FIG. 17, unlike some example embodiments, including the example embodiments shown in FIG. 1, the connecting electrode 130 may be disposed on the insulation layer 140, in some example embodiments, on the same layer as the pixel electrode 151A. The connecting electrode 130 may be electrically connected to the common electrode 152A through a via hole 162 in the pixel definition layer 160.

Hereinafter, another example of the stretchable device according to some example embodiments is described.

Figure 18:
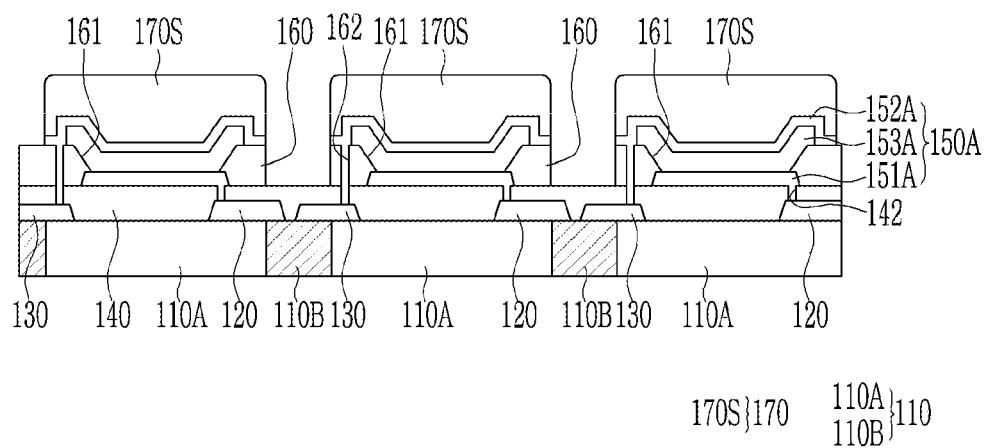
FIG. 18 is a cross-sectional view of another example of the stretchable device of FIG. 1 taken along line II-II' according to some example embodiments.

FIG. 18 is a cross-sectional view of some example embodiments of the stretchable device of FIG. 1 taken along line II-II'.

Referring to FIG. 18, the stretchable device 200 according to some example embodiments, like some example embodiments, including the example embodiments shown in FIG. 1, includes a substrate 110 having first regions 110A and second regions 110B; a transistor 120; a connecting electrode 130; an insulation layer 140; a plurality of unit devices 150A including a pixel electrode 151A, an active layer 153A, and a common electrode 152A; a pixel definition layer 160; and an encapsulant 170.

However, in the stretchable device 200 according to some example embodiments, including the example embodiments shown in FIG. 18, unlike some example embodiments, including the example embodiments shown in FIG. 1, the pixel definition layer 160, like the encapsulant 170, may be respectively present in isolation on the first regions 110A of the substrate 110 and separated in each pixel PX with the second regions 110B of the substrate 110 therebetween. Each pixel definition layer 160 has openings 161 and via holes 162 and specific details thereof are described above.

Since the stretchable device 200 according to some example embodiments includes the common electrode 152A, the encapsulant 170, and the pixel definition layer 160 which are respectively isolated in each pixel PX on the first regions 110A of the substrate 110, compared with a case of including the common electrode 152A, the encapsulant 170, and/or the pixel definition layer 160 which are respectively continuously formed, when the substrate 110 is stretched by an external force or an external movement, the common electrode 152A, the encapsulant 170, and the pixel definition layer 160 may be prevented from destruction or damage, and accordingly, materials for improving performance of the common electrode 152A, the encapsulant 170, and the pixel definition layer 160 may be freely selected. Accordingly, the stretchable device 200 may be effectively realized without performance degradation of the common electrode 152A, the encapsulant 170, and the pixel definition layer 160.

Hereinafter, another example of the stretchable device according to some example embodiments is described.

Figure 19:
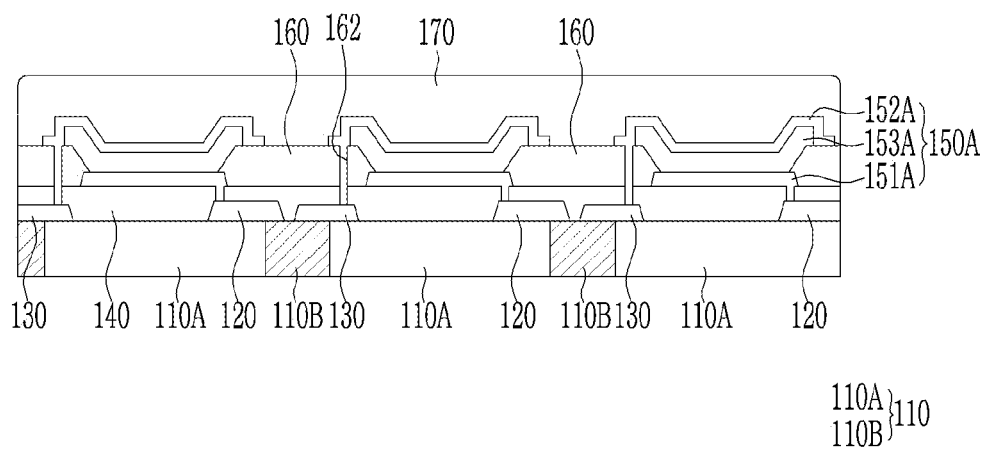
FIG. 19 is a cross-sectional view of another example of the stretchable device of FIG. 1 taken along line II-II' according to some example embodiments.

FIG. 19 is a cross-sectional view of some example embodiments of the stretchable device of FIG. 1 taken along line II-II'.

Referring to FIG. 19, the stretchable device 200 according to some example embodiments, like some example embodiments, including the example embodiments shown in FIG. 1, includes a substrate 110 having first regions 110A and second regions 110B; a transistor 120; a connecting electrode 130; an insulation layer 140; a plurality of unit devices 150A including a pixel electrode 151A, an active layer 153A, and a common electrode 152A; a pixel definition layer 160; and an encapsulant 170.

However, the stretchable device 200 according to some example embodiments, including the example embodiments shown in FIG. 19, unlike some example embodiments, including the example embodiments shown in FIG. 1, may include the encapsulant 170 continuously disposed on the whole surface of the substrate 110. The encapsulant 170 may include a cured product of a photosensitive elastomer. Herein, the encapsulant 170 may include an elastomer stretchable together, when the substrate 110 is stretched by an external force or external movement. Accordingly, when the substrate 110 is stretched by an external force or external movement, the encapsulant 170 may also be neither broken nor damaged but flexibly stretchable and thus effectively block or prevent the inflow of oxygen, moisture, and/or contaminants from the outside and thus effectively protect the plurality of unit devices 150A. In addition, since the patterning including photolithography and development of the thin film 170-1 for the encapsulant in some example embodiments may be omitted, the process may be simplified, and the unit device 150A thereunder may be prevented from damage during the patterning.

In some example embodiments, the encapsulant 170 may be formed from an elastomer cross-linkable by heat or light, a mixture of the elastomer and a photoreactive material sensitive to heat or light, or a combination thereof. In some example embodiments, the encapsulant 170 may be formed from a photosensitive elastomer, a mixture of an elastomer and a photosensitive material, or a combination thereof. In some example embodiments, the encapsulant 170 may be formed from (e.g., a cured product of) a photosensitive elastomer capable of a low temperature processing, in some example embodiments, a photosensitive elastomer curable at a temperature lower than the glass transition temperature (Tg) of the substrate 110, for example a photosensitive elastomer that is curable at a temperature of less than or equal to about 150° C., less than or equal to about 120° C., less than or equal to about 100° C., about 28° C. to about 150° C., about 28° C. to about 120° C., about 28° C. to about 100° C., about 40° C. to about 150° C., about 40° C. to about 120° C., about 40° C. to about 100° C., about 50° C. to about 150° C., about 50° C. to about 120° C., or about 50° C. to about 100° C. In this way, the encapsulant 170 is formed from a photosensitive elastomer capable of a low-temperature processing, thereby preventing the substrate 110 made of the elastomer from being thermally damaged, such as thermal expansion or thermal contraction, during curing.

In some example embodiments, the photosensitive elastomer may be selected from elastomers having a photosensitive functional group, and may have the elastomer as a main chain and at least one photosensitive functional group in a side chain. The photosensitive elastomer may include, for example substituted or unsubstituted polysiloxane such as polydimethylsiloxane; an elastomer including a substituted or unsubstituted butadiene moiety such as styrene-ethylene-butylene-styrene; an elastomer including a urethane moiety; an elastomer including an acrylic moiety; an elastomer including an olefin moiety; or a combination thereof as a main chain of the elastomer and a photosensitive functional group such as a substituted or unsubstituted vinyl group or a substituted or unsubstituted (meth)acrylic group that is bound to the main chain. In some example embodiments, the photosensitive elastomer may be polyisoprene having an acrylic group having the following structural units shown in Chemical Formula 1, but is not limited thereto.

[Chemical Formula 1]

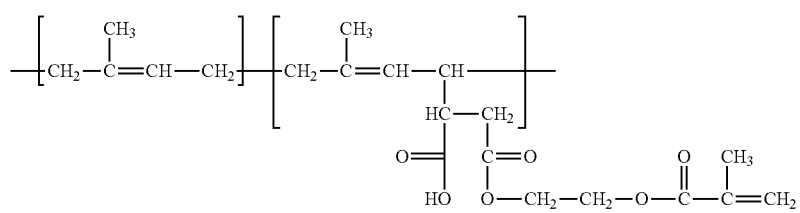

In some example embodiments, a mixture of the elastomer and a photoreactive material that is sensitive to heat or light may include an elastomer selected from substituted or unsubstituted polysiloxane such as polydimethylsiloxane; an elastomer including a substituted or unsubstituted butadiene moiety such as styrene-ethylene-butylene-styrene; an elastomer including a urethane moiety; an elastomer including an olefin moiety; or a combination thereof and an azide-containing compound, but is not limited thereto.

Hereinafter, another example of the stretchable device according to some example embodiments is described.

Figure 20:
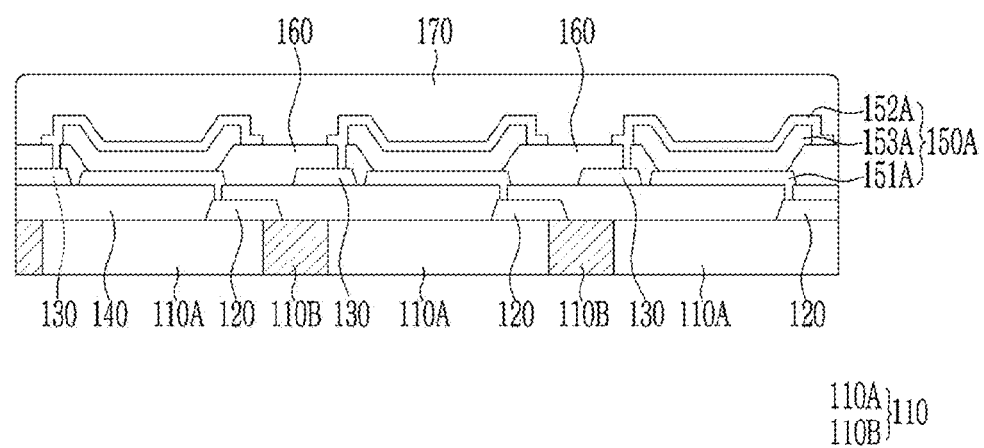
FIG. 20 is a cross-sectional view of another example of the stretchable device of FIG. 1 taken along line II-II' according to some example embodiments.

FIG. 20 is a cross-sectional view of some example embodiments of the stretchable device of FIG. 1 taken along line II-II'.

Referring to FIG. 20, the stretchable device 200 according to some example embodiments, like some example embodiments, including the example embodiments shown in FIG. 1, includes a substrate 110 having first regions 110A and second regions 110B; a transistor 120; a connecting electrode 130; an insulation layer 140; a plurality of unit devices 150A including a pixel electrode 151A, an active layer 153A, and a common electrode 152A; a pixel definition layer 160; and an encapsulant 170.

However, as for the stretchable device 200 according to the example embodiments shown in FIG. 20, unlike some example embodiments, including the example embodiments shown in FIG. 1, the connecting electrode 130 may be disposed on the insulation layer 140, in some example embodiments, on the same layer as the pixel electrode 151A. The connecting electrode 130 may be electrically connected to the common electrode 152A through a via hole 162 in the pixel definition layer 160.

Hereinafter, another example of the stretchable device according to some example embodiments is described.

Figure 21:
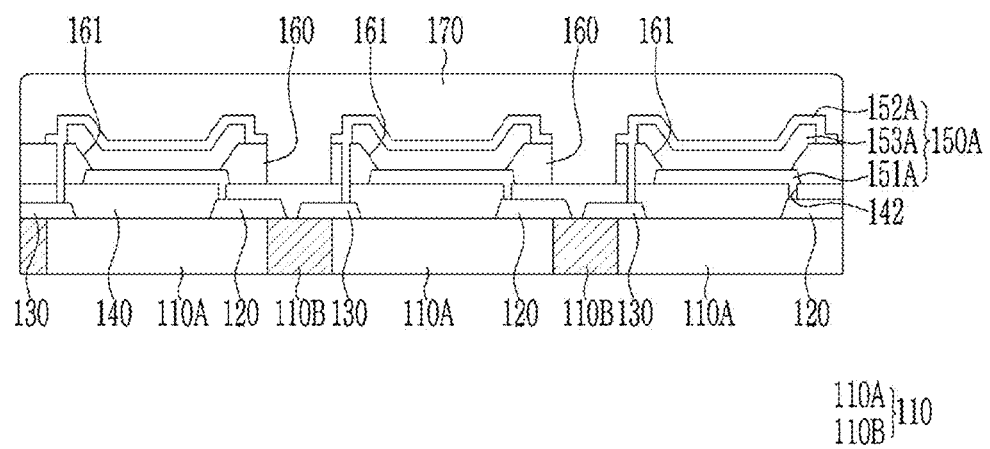
FIG. 21 is a cross-sectional view of another example of the stretchable device of FIG. 1 taken along line II-II' according to some example embodiments.

FIG. 21 is a cross-sectional view of some example embodiments of the stretchable device of FIG. 1 taken along line II-II'.

Referring to FIG. 21, the stretchable device 200 according to some example embodiments, like some example embodiments, including the example embodiments shown in FIG. 1, includes the substrate 110 having the first region 110A and the second region 110B; the transistor 120; the connecting electrode 130; the insulation layer 140; a plurality of unit device 150A including the pixel electrode 151A, the active layer 153A, and the common electrode 152A; the pixel definition layer 160; and the encapsulant 170.

However, the stretchable device 200 according to the example embodiments shown in FIG. 21, unlike some example embodiments, including the example embodiments shown in FIG. 1, the pixel definition layer 160 is respectively isolated on the first regions 110A of the substrate 110 and separated in each pixel PX with the second regions 110B of the substrate 110 therebetween. Each pixel definition layer 160 has openings 161 and via holes 162 and specific details thereof are described above.

The aforementioned stretchable device 200 may be applied to various devices requiring stretchability, in some example embodiments, a wearable device, a skin-like device, a large-area conformable display, smart clothing, and the like, but is not limited thereto.

In some example embodiments, the aforementioned stretchable device 200 may be included in a skin display panel.

Figure 22:
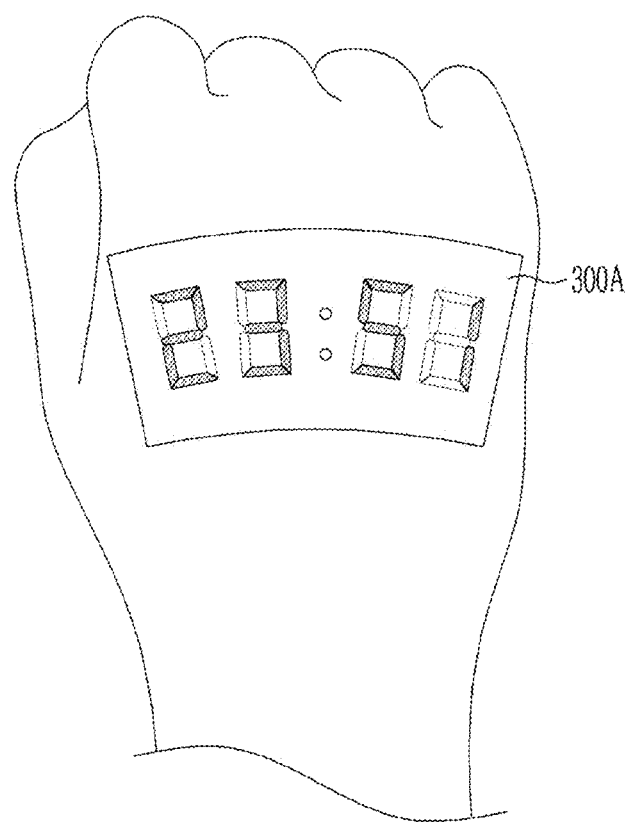
FIG. 22 is a schematic view showing an example of a skin-type display panel.
Figure 23:
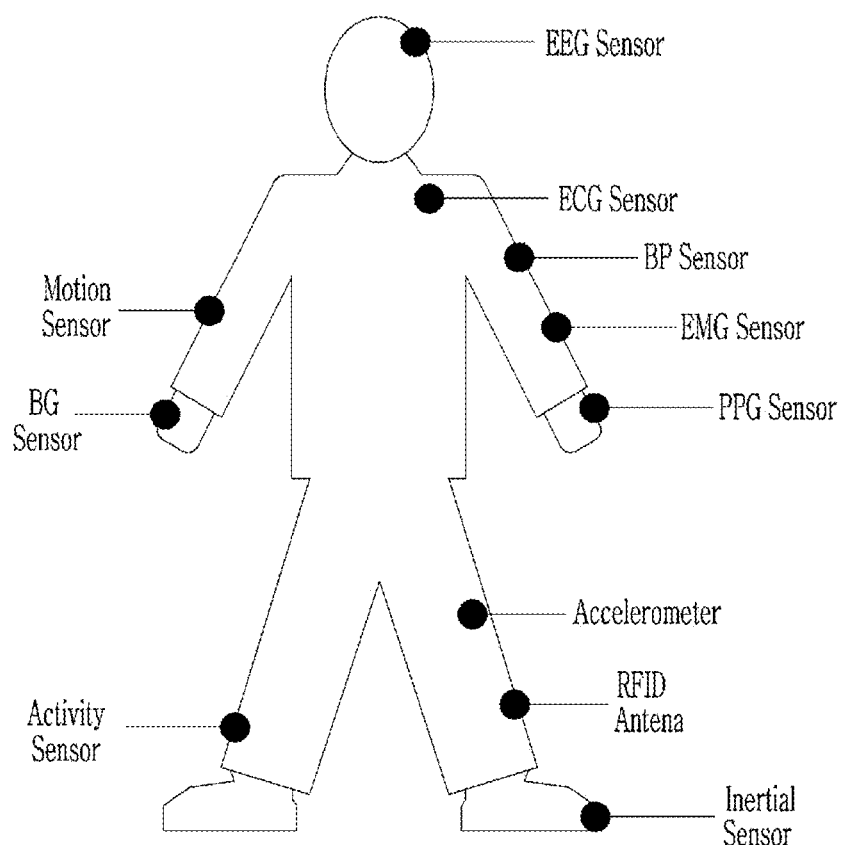
FIGS. 23, 24A, 24B, and 24C are schematic views showing examples of the attached biosensor according to some example embodiments.
Figure 24A:
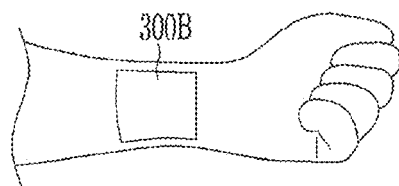
Figure 24B:
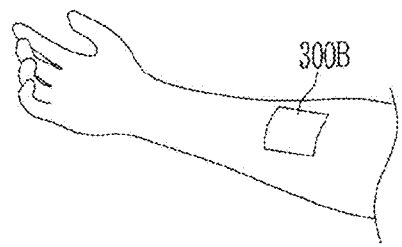
Figure 24C:
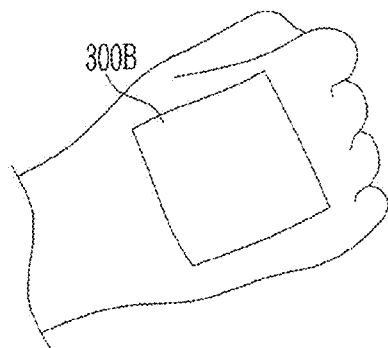

FIG. 22 is a schematic view showing an example of a skin display panel according to some example embodiments.

The skin display panel 300A may be an ultrathin display panel, and may be attached to a portion of a living body such as a hand. The skin display panel 300A may display particular (or, alternatively, predetermined) information such as various characters and/or images. The skin display panel 300A may include, in some example embodiments, inorganic light emitting diodes, micro light emitting diodes, organic light emitting diodes, quantum dot light emitting diodes, or perovskite light emitting diodes, but is not limited thereto.

In some example embodiments, the stretchable device 200 may be included in a sensor. As shown in FIGS. 23, 24A, 24B, and 24C, the sensor may be a biosensor, but example embodiments are not limited thereto.

FIGS. 23, 24A, 24B, and 24C are schematic views showing examples of the biosensor according to some example embodiments.

The biosensor 300B may be an attachable biosensor, and may be attached to a surface of a living body such as a skin, a living body such as an organ, or an indirect means for contacting a living body such as clothing to detect and measure biological information such as a biological signal. In some example embodiments, the biosensor 300B includes an electroencephalogram (EGG) sensor, an electrocardiogram (ECG) sensor, a blood pressure (BP) sensor, an electromyography (EMG) sensor, a blood glucose (BG) sensor, a photoplethysmography (PPG) sensor, an accelerometer, a RFID antenna, an inertial sensor, an activity sensor, a strain sensor, a motion sensor, or a combination of these, but is not limited thereto. The biosensor 300B may be attached to a living body in a very thin patch-type or band-type, so that the biological information may be monitored in real time.

Figure 25:
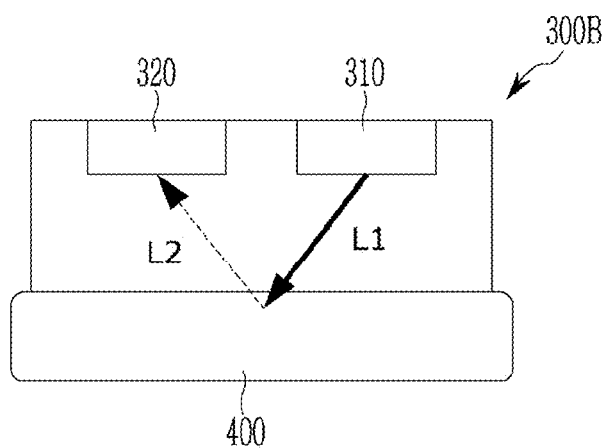
FIG. 25 is a schematic view showing an example of a biosensor according to some example embodiments.

FIG. 25 is a schematic view showing an example of an operation of a biosensor according to some example embodiments.

Referring to FIG. 25, the biosensor 300B includes a light emitting diode 310 and a photoelectric conversion device 320. The light emitting diode 310 may include, in some example embodiments, an inorganic light emitting diode, an organic light emitting diode, or a micro light emitting diode. The photoelectric conversion device 320 may include, in some example embodiments, a photodiode or a photoelectric conversion layer.

The light emitting diode 310 may be configured to emit a first light L1 (e.g., light having a first wavelength spectrum) for sensing a biological signal. The light emitting diode 310 may be for example an infrared light emitting diode configured to emit first light (L1) in an infrared wavelength region (e.g., wavelength spectrum) or a visible light emitting diode configured to emit the first light (L1) in a visible wavelength region. The first light (L1) emitted from the light emitting diode 310 may be reflected by or absorbed in a subject 400 (e.g., a body such as a skin or a blood vessel). In some example embodiments, the aforementioned stretchable device 200 may be included in the light emitting diode 310.

The photoelectric conversion device 320 may be configured to sense a second light (L2) reflected by the subject 400 from the first light (L1) emitted from the light emitting diode 310, and thus convert the second light (L2) into electric signals. Restated, the photoelectric conversion device may be configured to sense the second light (L2) based on reflection of the first light (L1) by an object, such as subject 400. The electric signals converted from the reflected second light (L2) may include biometric information. Electric signals including biometric information may be transmitted to a sensor IC (not shown) or a processor (not shown). In some example embodiments, the aforementioned stretchable device 200 may be included in the photoelectric conversion device 320.

In some example embodiments, the aforementioned stretchable device 200 may be included in the light emitting diode 310 and the photoelectric conversion device 320, respectively. Thus, it will be understood that at least one of the light emitting diode 310 or the photoelectric conversion device 320 may include the stretchable device 200.

As an example, the biosensor 300B may be a photoplethysmography sensor (PPG), and the biological information may include a heart rate, oxygen saturation, stress, arrhythmia, blood pressure, and the like, and may be obtained by analyzing waveforms of electric signals.

In some example embodiments, the biosensor 300B may be an electromyography (EMG) sensor or a strain sensor attached to a joint for rehabilitation treatment of patients with joint and muscle problems. The electromyography (EMG) sensor or the strain sensor may be attached to a desired site to quantitatively measure muscle movement or joint movement to secure data necessary for rehabilitation.

The aforementioned skin display panel or biosensor may be included in various electronic devices, and the electronic device may further include a processor (not shown) and a memory (not shown).

Figure 26:
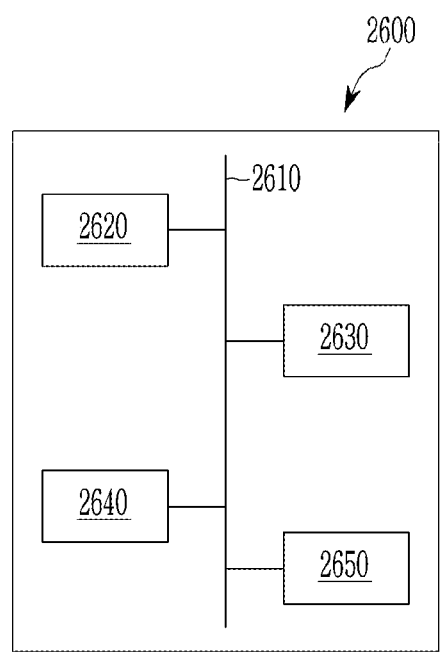
FIG. 26 is a schematic diagram of an electronic device according to some example embodiments.

FIG. 26 is a schematic diagram of an electronic device according to some example embodiments. The electronic device 2600 shown in FIG. 26 may be an electronic device according to any of the example embodiments.

Referring to FIG. 26, an electronic device 2600 includes a processor 2620, a memory 2630, a sensor 2640, and a display device 2650 electrically connected through a bus 2610. The sensor 2640 may be any of the sensors according to any of the example embodiments. The display device 2650 may be any of the display panels according to any of the example embodiments. In the example embodiments shown in FIG. 26, the electronic device 2600 may include both a sensor 2640 and a display device 2650, but example embodiments are not limited thereto: in some example embodiments the electronic device 2600 may include one of the sensor 2640 or the display device 2650.

In some example embodiments, some or all of the electronic device 2600 may include or be included in a stretchable device according to any of the example embodiments. For example, in some example embodiments, the electronic device 2600 may include a stretchable device 200 that includes at least one of the sensor 2640 or the display device 2650, and the memory 2630, processor 2620, and bus 2610 may be on the substrate 110 of the stretchable device 200 and coupled to the unit device array 150 of the stretchable device 200, for example based on the connecting electrode(s) 130 being coupled to bus 2610, processor 2620 independently of the bus 2610, or the like. In some example embodiments, the stretchable device 200 may be limited to the sensor 2640 and/or display device 2650 included in the electronic device 2600, wherein the bus 2610, memory 2630, and processor 2620 are external to the stretchable device 200 and coupled thereto (e.g., via bus 2610) to establish the electronic device 2600.

The processor 2620 may perform a memory program and thus at least one function, including controlling the sensor 2640 and/or displaying an image on the display device 2650. The processor 2620 may generate an output.

While the inventive concepts have been described in connection with what is presently considered to be practical example embodiments, it is to be understood that the inventive concepts are not limited to the above-described example embodiments. On the contrary, the inventive concepts are intended to cover various modifications and equivalent arrangements included within the spirit and scope of the appended claims.

What is claimed is:

1. A sensor, comprising:
a stretchable device, the stretchable device including
a substrate, the substrate including a plurality of first regions having a first stiffness and a second region between adjacent first regions of the plurality of first regions and having a second stiffness that is lower than the first stiffness;
a unit device array, the unit device array comprising a plurality of unit devices on separate, respective first regions of the plurality of first regions of the substrate; and
an encapsulant covering the unit device array,
wherein the unit device array includes
a plurality of pixel electrodes isolated on separate, respective first regions of the plurality of first regions of the substrate,
a plurality of common electrodes isolated on separate, respective first regions of the plurality of first regions of the substrate, the stretchable device configured to apply a same voltage to the plurality of common electrodes, and
a plurality of active layers on separate, respective first regions of the plurality of first regions of the substrate, each active layer between a separate pixel electrode of the plurality of pixel electrodes and a separate common electrode of the plurality of common electrodes.

2. The sensor of claim 1, wherein the substrate includes an elastomer.

3. The sensor of claim 1, wherein a difference between elastic moduli of the plurality of first regions and the second region of the substrate is about 100 times to about 100,000 times.

4. The sensor of claim 1, wherein
an elongation rate of the plurality of first regions of the substrate is less than or equal to about 5%, and
an elongation rate of the second region of the substrate is about 10% to about 100%.

5. The sensor of claim 1, wherein
the plurality of first regions of the substrate each have an island-shape and are isolated from direct contact with each other, and
the second region of the substrate is a single, continuous structure in the substrate.

6. The sensor of claim 1, wherein the stretchable device further includes
a connecting electrode connecting the plurality of common electrodes.

7. The sensor of claim 6, wherein
the connecting electrode is on the second region of the substrate, or
the connecting electrode is on both the plurality of first regions of the substrate and the second region of the substrate.

8. The sensor of claim 6, wherein the connecting electrode is a stretchable electrode.

9. The sensor of claim 8, wherein the connecting electrode includes conductive nanostructures.

10. The sensor of claim 6, further comprising:
a pixel definition layer between adjacent unit devices of the unit device array, the pixel definition layer having via holes corresponding to separate, respective unit devices of the unit device array,
wherein each common electrode is connected to the connecting electrode through a separate via hole of the via holes of the pixel definition layer.

11. The sensor of claim 10, wherein the pixel definition layer includes an elastomer.

12. The sensor of claim 1, wherein the encapsulant includes a plurality of encapsulants that are isolated from direct contact with each other and are on separate, respective first regions of the plurality of first regions of the substrate.

13. The sensor of claim 12, wherein the plurality of encapsulants and the plurality of common electrodes have a same planar shape.

14. The sensor of claim 1, wherein the encapsulant is on a whole surface of the substrate and includes a cured product of a photosensitive elastomer.

15. The sensor of claim 14, wherein the photosensitive elastomer is curable at a temperature of less than or equal to about 100 ° C.

16. The sensor of claim 1, wherein the sensor comprises:
a light emitting diode configured to emit a first light, and
a photoelectric conversion device configured to sense a second light generated based on reflection of the first light by an object,
wherein at least one of the light emitting diode or the photoelectric conversion device includes the stretchable device.

17. The sensor of claim 1, wherein the sensor is a biosensor.

18. An electronic device comprising the sensor of claim 1.

* * * * *